United States Patent
Martin et al.

(10) Patent No.: US 6,717,797 B1
(45) Date of Patent: Apr. 6, 2004

(54) APPARATUS, METHODS AND ARTICLES OF MANUFACTURE FOR A MODULE BOX WITH INTEGRATED COMPONENTS

(75) Inventors: Galen Monroe Martin, Camp Hill, PA (US); Matthew F. Foriska, Harrisburg, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/302,142

(22) Filed: Nov. 22, 2002

(51) Int. Cl.[7] .................................................. H02B 1/00
(52) U.S. Cl. ...................... 361/601; 361/641; 361/807; 361/809; 174/52.1; 220/4.02
(58) Field of Search ................................. 361/601, 627, 361/628, 630, 641, 642, 646, 669, 670; 174/52.1; 248/500, 503.1

(56) References Cited

U.S. PATENT DOCUMENTS

| | | | | |
|---|---|---|---|---|
| 5,396,404 A | * | 3/1995 | Murphy et al. | 361/719 |
| 5,734,555 A | * | 3/1998 | McMahon | 361/704 |
| 5,912,804 A | * | 6/1999 | Lawson et al. | 361/704 |
| 6,265,840 B1 | * | 7/2001 | Wiezorek et al. | 318/434 |
| 6,300,564 B1 | * | 10/2001 | Moraes et al. | 174/52.1 |
| 6,522,528 B2 | * | 2/2003 | Yamane | 361/601 |
| 6,552,912 B1 | * | 4/2003 | Kanazawa et al. | 361/752 |

* cited by examiner

Primary Examiner—Boris Chervinsky

(57) ABSTRACT

An assembly that mounts components to a module box is disclosed. Large components, such as capacitors, can take up appreciable amounts space on a circuit board. If these components are mounted to the module box, there will be more surfaces on the circuit for other components. In an illustrated embodiment, three capacitors are mounted to a module box using three separate plastic cradles. The module can be made of plastic or metal as necessary. The component cradles are preferably secured to the box by an interference fit between the hole and posts. Alternate methods to secure the component cradles include snap fit, heat staking or epoxy. The component cradles also provide alignment of the pins that extend through the circuit that will eventually be mounted on the box. The pins are electrically fixed to the circuit board by either solder or press fit means.

17 Claims, 3 Drawing Sheets

APPARATUS, METHODS AND ARTICLES OF MANUFACTURE FOR A MODULE BOX WITH INTEGRATED COMPONENTS

FIELD OF THE INVENTION

The present invention relates generally to electrical connectors and more particularly relates to electrical connectors for connecting components to circuit boards.

BACKGROUND OF THE INVENTION

Although modern equipment design follows a general trend of miniaturization, there are a number of electrical and electronic components that are included in assemblies and subassemblies that for both technical and practical reasons remain relatively large and cannot be integrated into other circuits or cannot have their functions taken over by a microprocessor. For example, one electronic component that ordinarily remains physically large to be effective is a high power capacitor. High power capacitors are typically individually mounted and both electrically connected and secured mechanically against movement due to shock and vibration. Other components with similar requirements include power supplies, coils and any of a number of devices.

Prior art capacitors are mounted to connectors, and the capacitor/connector subassembly is then soldered to the circuit board, however, a gap remains beneath the capacitor for mounting other components. Referring now to FIG. 1, an exemplary prior art assembly is shown in which a circuit board 10 receives a connector 50 that includes an integral capacitor carrier 52. The capacitor carrier 52 is designed to securely mount a capacitor 20. The connector subassembly 50 is brought into alignment with the circuit board 10 using alignment posts 54. These alignment posts 54 retain the connector 50 in position while it is soldered in place, so as to create an electrical pathway that is also mechanically secure. Soldering typically entails a two-step process, wherein circuit board pins extend from the capacitor 20 and into the connector. The connector, in turn, is provided with the solder pins 56 to provide the conductive path to the circuit board. A disadvantage of this process, however, is that access to the surface of the circuit board 10 is blocked.

It would be desirable to provide an improved system whereby a component can be mounted and electrically connected to a circuit board yet permit additional components to be mounted. It would be further desirable to permit multiple components to be assembled into a subassembly, and the subassembly in turn mounted to a circuit board in a less cumbersome and more efficient manner than known heretofore.

SUMMARY OF THE INVENTION

Accordingly, in connection with an embodiment of the present invention, a module box and one or more component cradles are provided in a manner so that the electrical components are disposed between the module box and the component cradle. In certain embodiments, alignment holes adapted to receive one or more circuit board pins are provided, and in other embodiments, the component cradles and/or the module box have mounting features, such as mounting holes or press fit posts that are assembled respectively to provide a secure structure. Preferably, the press fit posts are integrally molded with the module box. In certain embodiments, two or more component cradles are used, and each is an independent structure In another aspect, methods of assembling a component to a circuit board are disclosed in which the steps of installing a component and component cradle in a module box and assembling the module box to the circuit board are undertaken. The step of installing may either entail installing a component into the module box and installing a component cradle, or alternatively, may entail installing a component into a component cradle, and installing the component and component cradle in the module box. In certain embodiments, a component is installed by guiding a circuit board pin extending from the component into a respective alignment hole, and more preferably positioning the component so that the circuit board pin extends beyond the component cradle. In certain embodiments of this aspect of the invention, the step of installing the component cradle into the module box may involve guiding a press fit pin into a corresponding press fit hole.

In addition, an embodiment of an article of manufacture is provided that has a module box and at least one component cradle adapted to attach to the module box, and press fit pins, may used to hold them together after the component is inserted between them. Also, in certain embodiments, the component cradles have at least one alignment hole to aid in assembly.

DETAILED DESCRIPTION

Figure 2:
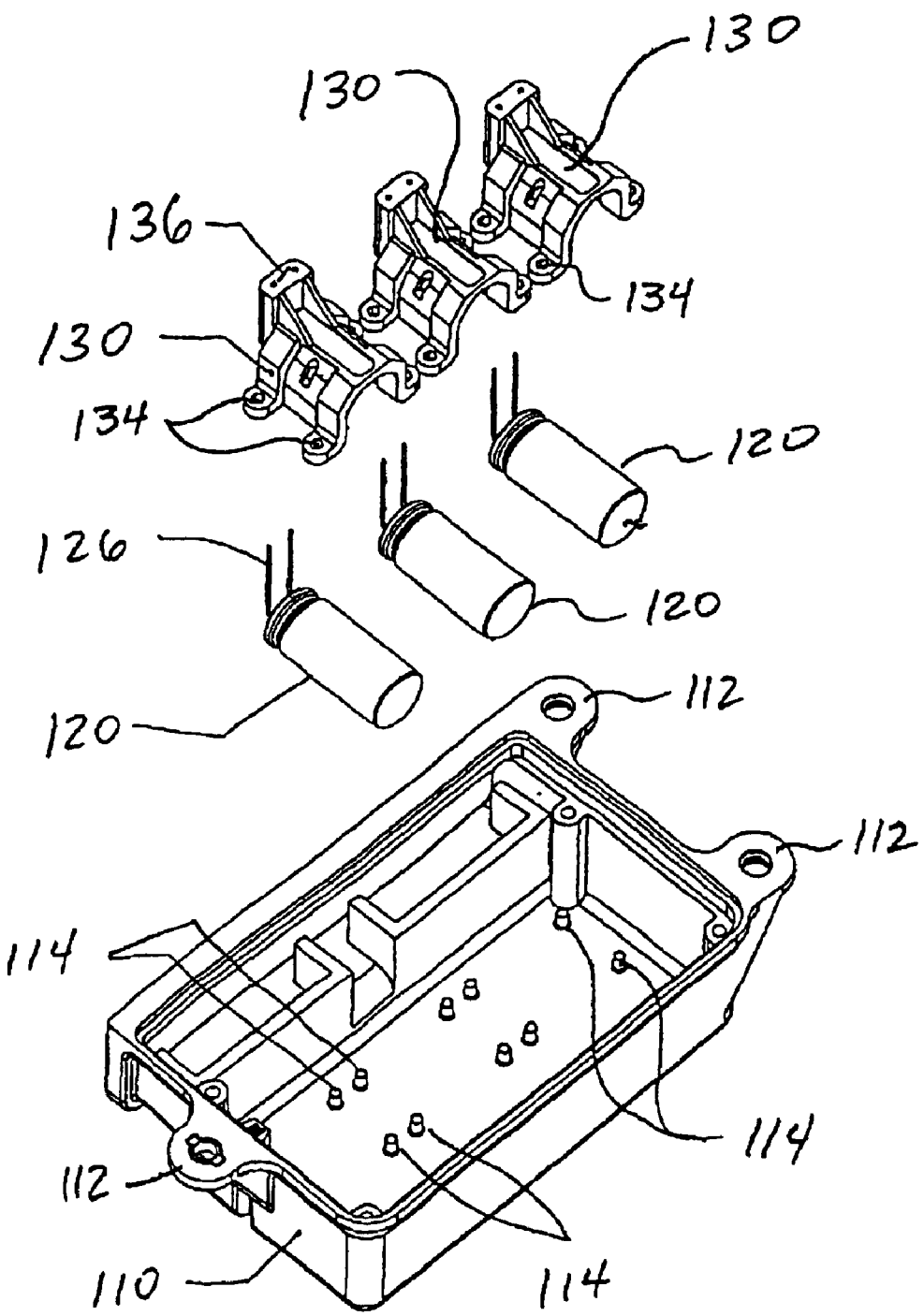
FIG. 2 is an exploded perspective view of one embodiment of an circuit board and capacitor assembly of the present invention.

Referring now to the drawings in detail, wherein like reference numerals indicate like elements throughout the several views, there is illustrated in FIG. 2 an exploded perspective view of one embodiment of an assembly 100 in accordance with the present invention. The assembly 100 has three primary components in this embodiment: a module box 110, capacitors (or other components) 120, and component cradles 130. Although this embodiment is designed to accommodate three capacitors, it should be understood that the present embodiment is not limited in terms of either the type or number of components that can be mounted and is applicable to a wide variety of situations. In embodiments where multiple components are retained in the component cradles 130, the components may either be individual units or may be made into one or more integral units. Additionally, the module box 110 is preferably a shell or enclosure made of metal, or molded from an insulating or polymeric material, such as any of the numerous materials well known to those of ordinary skill in the art. As should be understood, however, any other suitable materials can be utilized for the module box 110. The module box 110 may also provide a sealed environment where desired, or alternatively, constructed so as not to provide a sealed environment, and/or include features such as mounting flanges 112 illustrated in FIG. 2 that permit the module box 110 to be attached to another assembly, such as a circuit board (not illustrated). The manner of attachment can take the form of any of a number of well-known techniques utilizing mounting features including mechanical fasteners, or press-fit or snap fit structures that are either separate components or integral with the next higher assembly (not illustrated), as examples.

Thus, the term "mounting features" is to be interpreted broadly and meant to encompass any structure that mounts the module box 110 to another structure.

The module box 110 also preferably includes one or more press fit posts 114. As the case with the mounting flanges 112, these internal mounting features are also either integrally molded into the module box 110 or may be inserted as separate components. As should be understood by those of ordinary skill in the art, the module box 110 may include other structural features such as ribs, flanges, grooves, apertures and the like that are necessary for a particular application and assembly. The relative diameters and tolerances of apertures and posts to create a press fit are readily determined using conventional techniques.

Also seen in FIG. 2 is a plurality of component cradles 130. As explained further below, these component cradles 130 are installed in the module box 110 and retain the capacitors 120 or similar components. The component cradles 130 preferably include mounting holes 134 that cooperate with the press fit posts 114. The component cradles also preferably include alignment holes 136 that receive the circuit board pins 126 that extend from the capacitors 120 or similar components. As noted above with reference to the module box 110, the component cradles 130 may include other features such as ribs, flanges, grooves, apertures and the like that are necessary for a particular application and assembly. These additional features are preferably designed to provide both the necessary structural strength, while not unnecessarily filling volume within the subassembly, so that other components can be accommodated.

Figure 3:
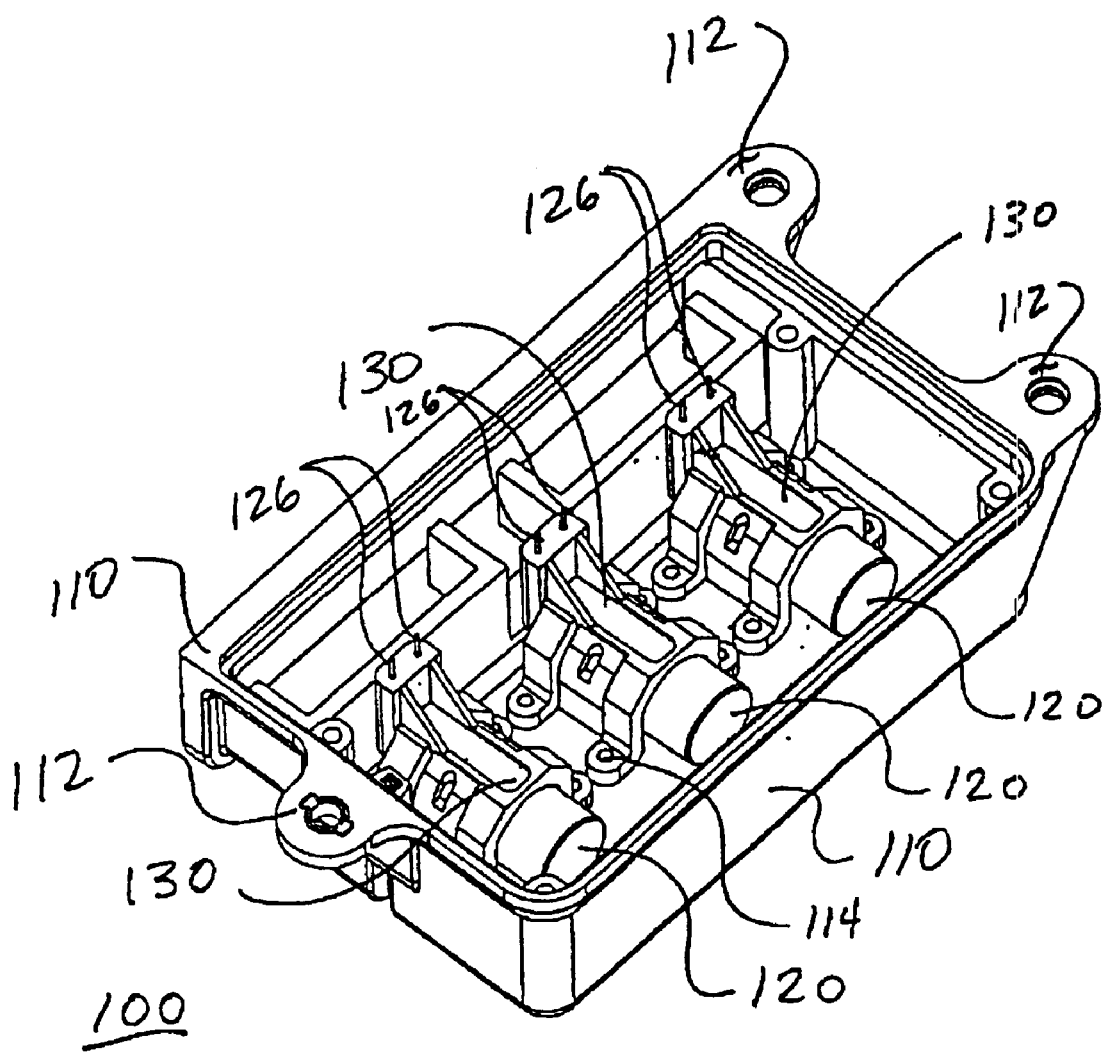
FIG. 3 is a perspective view of the assembly illustrated in FIG. 2, with the components shown in a mounted position.

Referring now to FIG. 3, an assembly of the components illustrated in FIG. 2 is shown in a perspective view. As illustrated, the capacitors 120 are disposed between the module box 110 and the component cradles 130. The component cradles 130 are preferably mounted to the module box 110 by being press fit between the press fit posts 114 and the mounting holes 134 as described above with reference to FIG. 2. Although a properly designed press fit is sufficient for certain embodiments and applications, it should be understood that other forms of mechanical connection between the component cradles 130 and the module box 110 can be implemented in other embodiments of the present invention as well. Similarly, although the three capacitors 120 are restrained individually within three separate component cradles in the illustrated embodiment, those of ordinary skill in the art will realize that the component cradles 130 can alternately be designed as a single integral unit and effect the same result. The assembly process may encompass steps of mounting the electronic components, such as the capacitors 120, in the component cradles 130, and then attaching the component cradles 130 to the mounting box, or the components 120 may be placed or positioned in the module box 110, and the component cradles 130 placed atop them and fastened. Another aspect of this particular embodiment that is illustrated in FIG. 3 is the placement of the circuit board pins 126 within the alignment holes 136, so that the pins 126 extend beyond the component cradles 130, and provide sufficient length to protrude into corresponding electrical mounting points on a circuit board (not illustrated) or other mating structure to which the subassembly illustrated in FIG. 3 is assembled.

Figure 1:
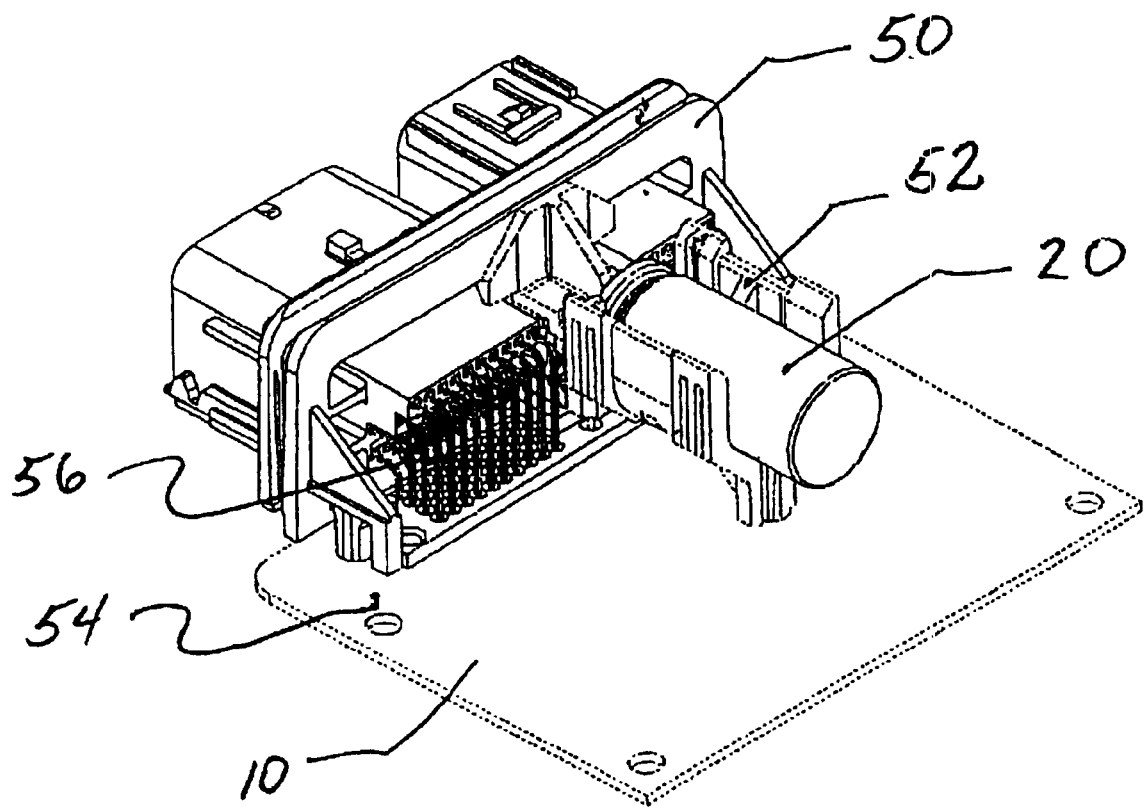
FIG. 1 is a perspective view of a prior art assembly of a circuit board and a capacitor.

In addition to the advantage of providing more accessible circuit board space, it will be appreciated by those of ordinary skill in the art that the relative loading of the components in an assembly, and the forces placed on those components, is markedly different in the device illustrated in FIG. 1. Importantly, heavy and bulky components, like the capacitors 120, are connected to a module box 110 that may be designed to perform under any required conditions of loading, shock, vibration, acceleration, etc. The stresses and strains borne by the module housing are not directly translated to the circuit board, but are instead distributed throughout the structure. Limiting the load placed on a circuit board is desirable since solder joints and the circuit board itself do not typically exhibit high degrees of strength, particularly when subjected to fatigue, relative to the materials and dimensions that can be chosen for the module housing 110, the cradles 130 and related components. Therefore, in addition to the ease of assembly and improved design aspects discussed above, it can be expected that improved performance over the life of the components, and the overall assembly, would be exhibited when the embodiments disclosed herein are implemented.

Although certain embodiments of the present invention have been specifically described, the invention is not intended to be limited thereby. Upon review of the foregoing description, adaptations, modifications, variations and alternatives that utilize the spirit of the invention embodied herein will occur to those of skill in the art. Accordingly, reference should be made to the appended claims in order to ascertain the full scope of the present invention.

What is claimed is:

1. A subassembly for electrical components comprising:
   a module box which substantially surrounds the electrical components; and
   one or more component cradles, wherein one or more of the electrical components are disposed between said module box and said component cradle,
   wherein each of the electrical components includes at least two terminals extending therefrom, and wherein each of the one or more component cradles includes at least two alignment holes for respectively receiving the at least two terminals.

2. The subassembly of claim 1, comprising two or more component cradles.

3. The subassembly of claim 2, wherein said two or more component cradles are independent units.

4. The subassembly of claim 1, wherein at least one of the module box and the component cradles is comprised of a polymeric material.

5. The subassembly of claim 1, wherein the one or more component cradles each include at least one alignment hole for receiving at least one circuit board pin that extends from the electrical components, and at least one mounting hole for receiving at least one means for mounting the one or more component cradles to the module box.

6. The subassembly of claim 5, wherein the means for mounting comprises one or more press fit posts.

7. The subassembly of claim 6, wherein the press fit posts are integrally molded with the module box.

8. A method of assembling a component to a circuit board comprising:
   installing at least one component and at least one component cradle in a module box; and assembling the module box to the circuit board, wherein the step of installing the at least one component and the at least one component cradle in the module box comprises disposing the at least one component cradle over top of the at least one component so that each of at least two terminals extending from the at least one component protrude through at least one of at least two alignment holes in the at least one component cradle.

9. The method of claim 8, wherein the step of installing comprises installing a component into the module box, and installing a component cradle.

10. The method of claim 8, wherein the step of installing comprises installing a component into a component cradle, and installing the component and component cradle in the module box.

11. The method of claim 8, wherein the step of installing a component comprises guiding a circuit board pin extending from the component into a respective alignment hole.

12. The method of claim 11, wherein the step of guiding a circuit board pin comprises positioning the component so that the circuit board pin extends beyond the component cradle.

13. The method of claim 8, wherein the step of installing the component cradle into the module box comprises guiding a press fit pin into a corresponding press fit hole.

14. The method of claim 8, wherein the step of installing comprises:

attaching the component to the component cradle so that at least one alignment hole in the component cradle receives at least one circuit board pin of the component; and, attaching the component cradle to the module box so that at least one mounting hole in the component cradle receives at least one means for mounting the component cradle to the module box.

15. An article of manufacture comprising a module box and at least one component cradle adapted to attach to the module box, the at least one component cradle including at least two alignment holes for receiving at least two circuit board pins of at least one component, and at least two mounting holes for receiving at least one means for mounting the at least one component cradle to the module box.

16. The article of manufacture of claim 15, wherein the means for mounting comprise press fit pins.

17. The article of manufacture of claim 16, wherein the press fit pins are disposed in the module box.

* * * * *